United States Patent
Wang

[11] Patent Number: 5,942,942
[45] Date of Patent: Aug. 24, 1999

[54] DIFFERENTIAL AMPLIFIER WITH DOUBLE OUTPUT STAGES

[75] Inventor: Yen-Hui Wang, Hsinchu, Taiwan

[73] Assignee: Holtek Semiconductor, Inc., Hsinchu, Taiwan

[21] Appl. No.: 08/940,791

[22] Filed: Sep. 30, 1997

[30] Foreign Application Priority Data

Aug. 28, 1997 [TW] Taiwan ................................. 86112413

[51] Int. Cl.$^6$ ....................................................... H03F 3/45
[52] U.S. Cl. ............................................ 330/258; 330/260
[58] Field of Search .................................. 330/253, 255, 330/258, 260

[56] References Cited

U.S. PATENT DOCUMENTS 4,697,152  9/1987  Westwick ............................. 330/260 X
5,117,199  5/1992  Wang et al. ......................... 330/258 X
5,216,380  6/1993  Carbou ................................. 330/253

Primary Examiner—Steven J. Mottola

[57] ABSTRACT

A differential amplifier with double output stages used to eliminate the charge injection noise and switching capacitor noise is disclosed. This system includes an input stage, a middle stage, a first balanced output stage, a second balanced output stage, a negative feedback network and a common mode feedback network. The input stage processing the differential input signal, connects to the middle stage and the negative feedback network which increasing the gain of input signal and connects to the first balanced output stage and second balanced output stage. The first balanced output stage is connected to the negative feedback network for stabilizing the frequency response, and the second balanced output stage is connected to the common mode feedback network for controlling the common level of double terminals output into a setting range of voltage. Thus the output signal of the amplifier will be a clear waveform without redundant noise for next connecting circuit.

5 Claims, 5 Drawing Sheets

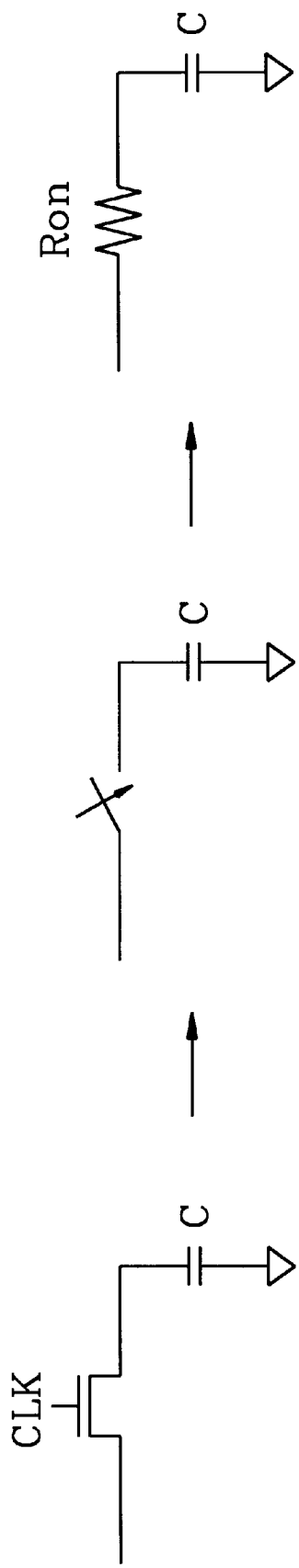
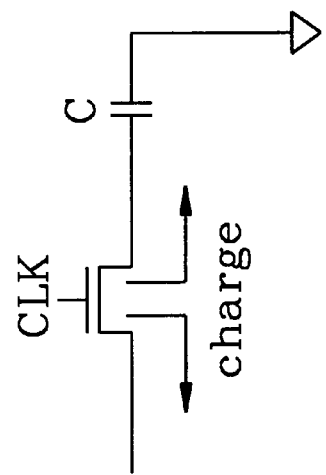
FIG. 1 (PRIOR ART)
FIG. 2 (PRIOR ART)

DIFFERENTIAL AMPLIFIER WITH DOUBLE OUTPUT STAGES

BACKGROUND OF THE INVENTION

1. Field of the Invention

The present invention relates to a differential amplifier with double output stages. More particularly, it relates to a differential amplifier which has double output stages. One of the output stages is a replica of another one. Such differential amplifier is a device that not only reduces the error of output signal, but also can avoid the disturbance of noise.

2. Background of the Invention

A conventional fully differential circuit usually used to the switched capacitor circuit, especially about switched capacitor filter. It must use the means of common mode feedback for the double terminals output of fully differential amplifier to control the common level of the double terminals output into a setting range of voltage, as usual, control the common level as the middle point of the setting range of voltage. In general, the common mode feedback circuit uses the structure of dynamic switched capacitor, and only one output stage used for providing the signal for the common mode feedback and the negative feedback circuits in the conventional balanced output operation amplifier. That is, the common mode feedback and negative feedback circuits use the same output stage, so that the charge injection noise and switching capacitor noise (KT/C) produced in the output signal which may result in operator error.

Referring to FIG. 1, is the schematic illustration of switching capacitor noise (KT/C). It's about the noise produced by the high frequency operation of switching mode element with series capacitor, and the effect for the noise of series capacitor could be a equivalent resistor shown in the schematic illustration of FIG. 1. FIG. 2 is the schematic illustration of charge injection noise. It shows that the switching mode element operated in the off state pushes the charge of the channel into the source and drain terminals, and produces an error voltage by the portion of charge into series capacitor. The error voltage may result in operator serious error which should be removed. FIG. 3 is the prior art that presents a switched capacitor filter utilizing a differential input and output circuit and method. The switched capacitor filter just uses only one output stage to provide output signal for a negative feedback and a common mode feedback, that is, the negative feedback circuit and the common mode feedback circuit are connected to the same output stage, and the output terminal will result in charge injection noise and switching capacitor noise which relieves the reliability of output signal.

As usual, reducing the switch size can resolve the problem of charge injection noise, but the switch size can't be reduced too much when the operation of circuit is rapidly modified. On the other hand, increasing the value of capacitor can resolve the problem of switching capacitor noise, but it will increase the chip area which result in more production cost. Moreover, using the two methods just reduce the two kind of noises but not filly eliminate the redundant noise. What is needed then is a circuit by which can efficiently eliminate the charge injection noise and switching capacitor noise.

SUMMARY OF THE INVENTION

The present invention relates to a differential amplifier with double output stages, which efficiently eliminate the charge injection noise and switching capacitor noise in the condition that the normal function of the circuit not be effected by the elimination. That is, the primary object of the present invention is to remove the noise by producing another output stage for another feedback network. For example, a fully differential amplifier includes the negative feedback and common mode feedback network, both of them use the same output stage, but now, the present invention provide two output stages, the first one is for the negative feedback network, and the second one is for the common mode feedback network. Moreover, the second one output stage just copies the first one output stage, it's mean that the same number of MOS transistors of the output stage replicated for the other one, so that the noise of output stage can be cleared away and increase the reliability of signal by the means of separating the terminal connecting of output stages for the negative feedback and the common mode feedback network. Furthermore, if the another part of the circuit has to be connected to the output stage, then the another output stage can be replicated expansively for connection in user friendly, so that the noise can be cleared away obviously.

BRIEF DESCRIPTION OF THE DRAWINGS

The foregoing features of the present invention may be more fully understood from the following detailed description, read in conjunction with the accompanying drawings, wherein:

FIG. 1 is a schematic illustration of switching capacitor noise (KT/C).

FIG. 2 is a schematic illustration of charger injection noise.

DETAILED DESCRIPTION OF THE PREFERRED EMBODIMENT

Figure 3:
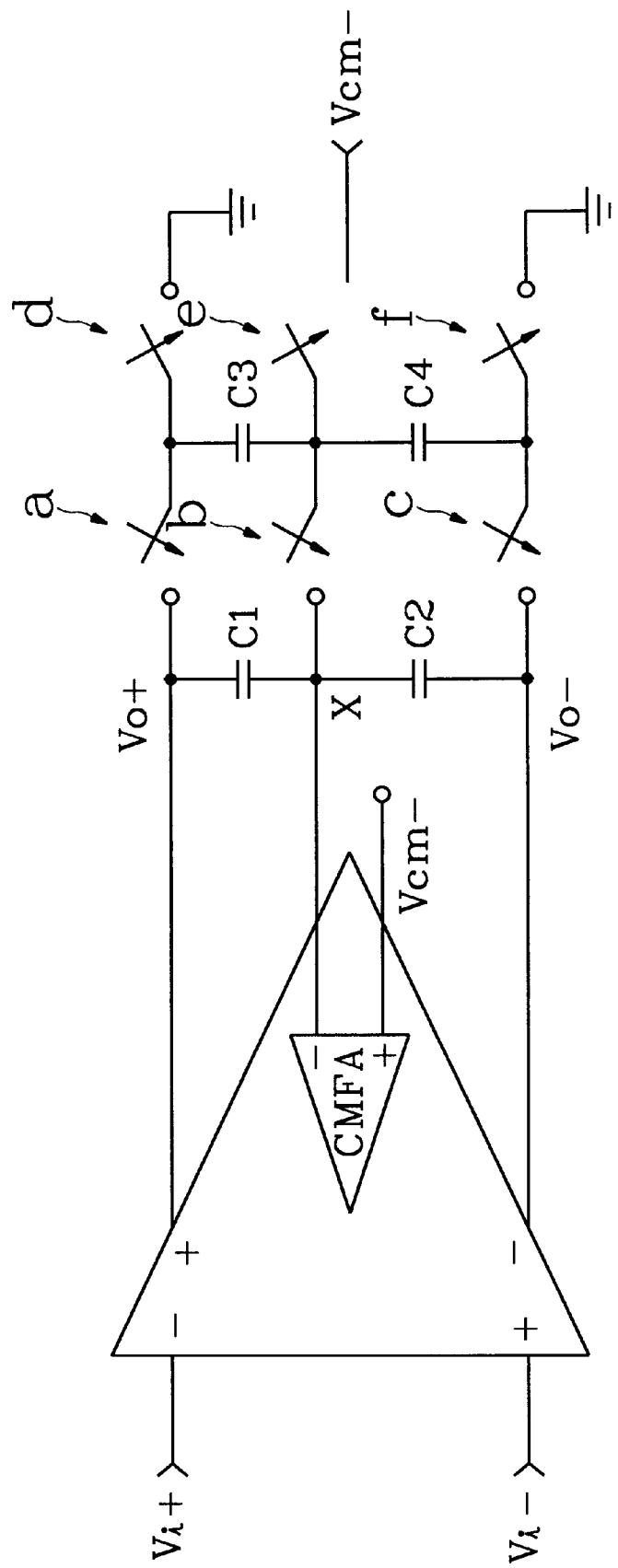
FIG. 3 is a prior art of switched capacitor filter utilizing a differential input and output circuit and method.
Figure 4:
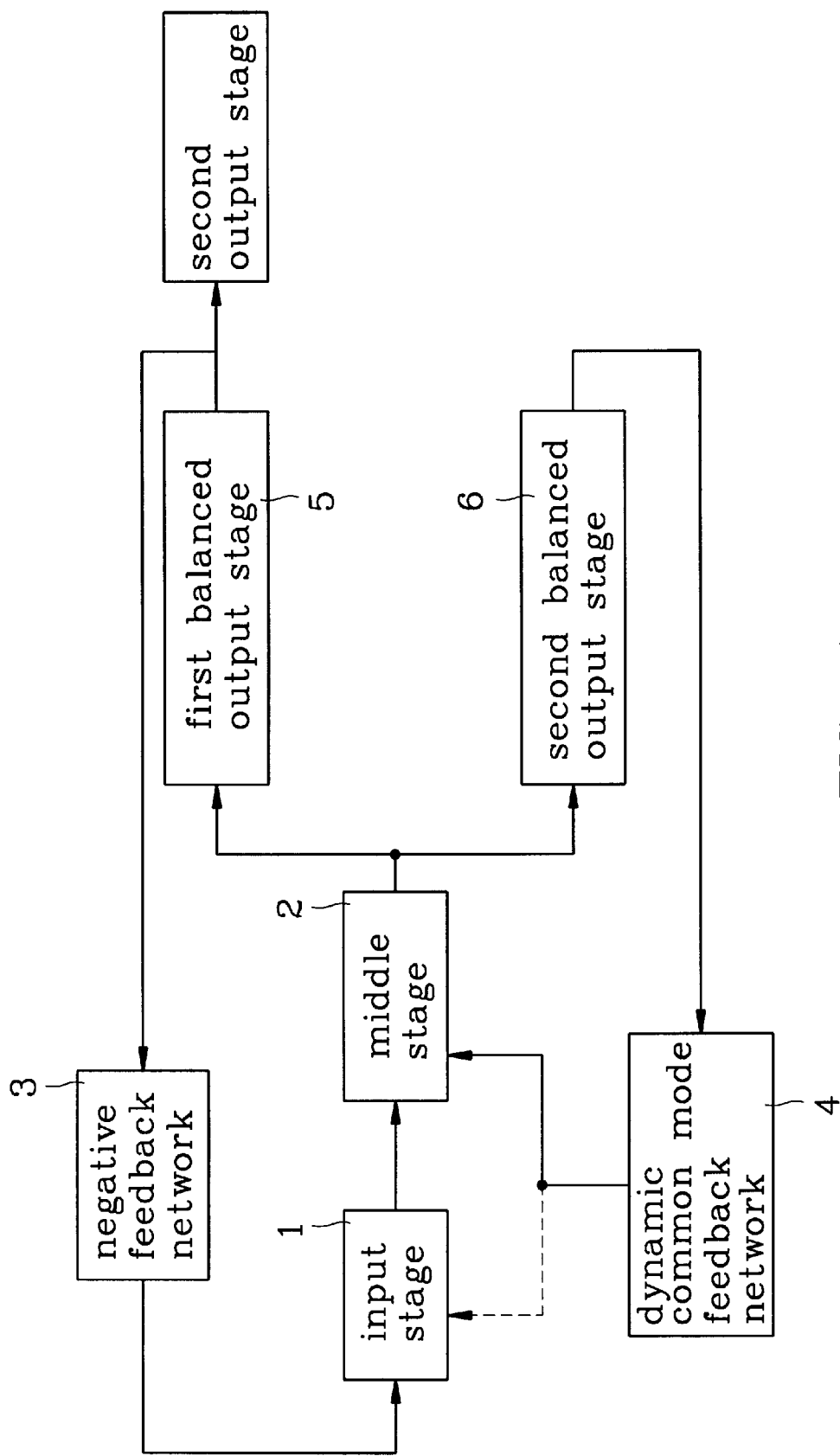
FIG. 4 is a block diagram of an embodiment according to the present invention.

Please referring to FIG. 4, there is shown a block diagram of an embodiment according to the present invention. That I emphasize is the embodiment according to the present invention just an example that only one output stage replicated for feedback network, moreover, the another output stage can be replicated expansively in user friendly, that is, an embodiment of the present invention could be expanded as more than two output stages by using the same replicated method, and the increment of the chip area is not very much.

The present invention shown in FIG. 4, comprises an input stage 1, a middle stage 2, a negative feedback network 3, a common mode feedback network 4, a first balanced output stage 5, and a second balanced output stage 6. The difference between the present invention and the conventional fully differential amplifier is the production of the second balanced output stage. According to the present invention, the differential input signal processed by the input stage 1 connected to the middle stage 2, then the output signal of middle stage 2 which increase the gain of input signal connected to the both of first balanced output stage 5 and the second balanced output stage 6 that act as the output buffer. The output signal of the first balanced output stage 5 is connected to the negative feedback network 3 which stabilize the frequency response of circuit, and the output signal of the second balanced output stage 6 is connected to the common mode feedback network 4 which control the common level of the double output terminals (i.e. balanced output) into a setting range of voltage. In addition, the negative feedback network 3 is connected to the input stage 1 as a feedback loop, and the common mode feedback network 4 is connected to the middle stage 2, on the other hand, the common mode feedback network 4 also could be connected to the input stage 1 as a loop circuit. It means that separating the output stage for different feedback network, can eliminate the noise efficiently.

Figure 5:
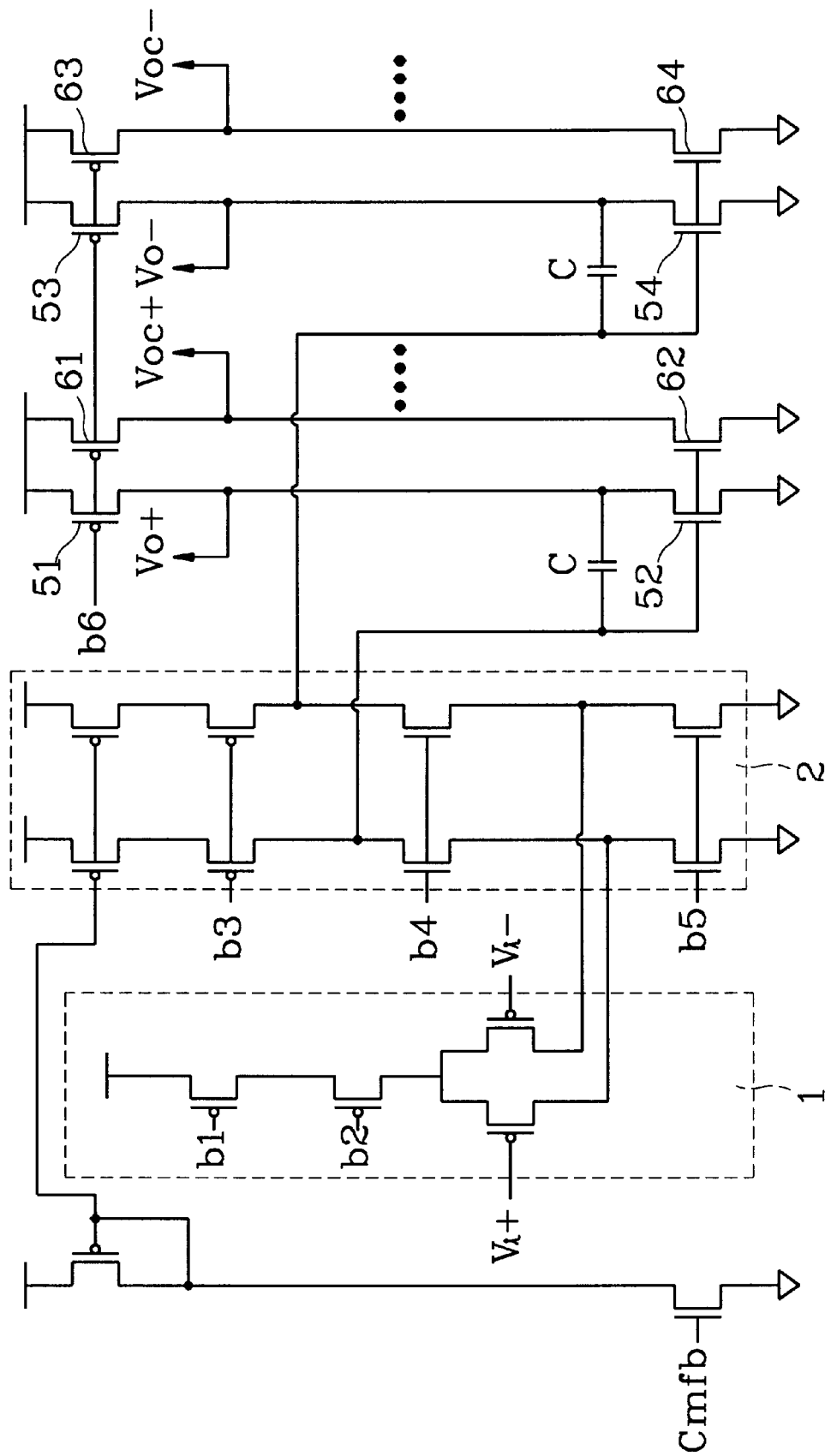
FIG. 5 is an electric circuit diagram of an embodiment according to the present invention.

FIG. 5 is a circuit diagram of an embodiment according to the present invention. It shows the detailed circuit diagram of the present invention, that includes the detailed electric circuit of the input stage 1 and output stage 2. The first balanced output stage 5 is composed of MOS transistors 51, 52, 53 and 54. The second balanced output stage 6 is composed of MOS transistors 61, 62, 63 and 64. Moreover, the MOS transistors 51, 52, 53 and 54 correspond to the MOS transistors 61, 62, 63 and 64 respectively. If takes into account the other requirement of practical circuit, it can replicate more groups of MOS transistors as output stage. The characteristic of replicated output stage could be described into three points as follows:

1. Replicating the same number of MOS transistors of one output stage to the other one. The replicated MOS transistors are connected to the bias circuit and signal path of the two output stages, and every output stage includes the double output terminals. (i.e. balanced output). One of the double output terminals is positive output and the other one is negative output.
2. The value of capacitor con be decreased by the means of not considering the noise of switched capacitor, which result from that the second output stage only drives the common mode feedback network. Furthermore, replicates the second output stage can decrease the loading, so that, the chip area of second output stage can be in a ratio of the original output stage.
3. The present invention can decrease the chip area of second output stage because it need not using the compensation capacitor that increase the phase margin of frequency response, which result from the second output stage is not connected to the negative feedback network.

Concerning the connection of the two output stage, first of all, fully replicate the MOS transistors 51 and 52 into MOS transistors 61 and 62, by using the same way, replicate the MOS transistors 53 and 54 into MOS transistors 63 and 64 similarly, it means that the MOS transistors 61 and 62 are replaced with the MOS transistors 51 and 52 and the MOS transistors 63 and 64 are replaced with the MOS transistors 53 and 54. Secondly, the signal $V_{oc+}$ connecting between the MOS transistors 61 and 62 is used for the common mode feedback network, and the signal $V_{oc-}$ connected between the MOS 63 and 64 is also used for the common mode feedback network similarly.

The bias signal b6 is commonly used by MOS transistors 51, 61, 53 and 63, the signal b1, b2, b3, b4, b5, b6 and b7 are also the bias signals, the signal cmfb is the common feedback signal, $V_{i+}$, $V_{i-}$ are the two signals of differential input voltage, and the output signals of the second balanced output stage 6 are $V_{oc+}$, $V_{oc-}$ which connected to the common mode feedback network 4. On the other hand, the signals which connected to the negative feedback network 3 are the $V_{o+}$, $V_{o-}$, that act as the output of first balanced output stage 5.

Figure 6:
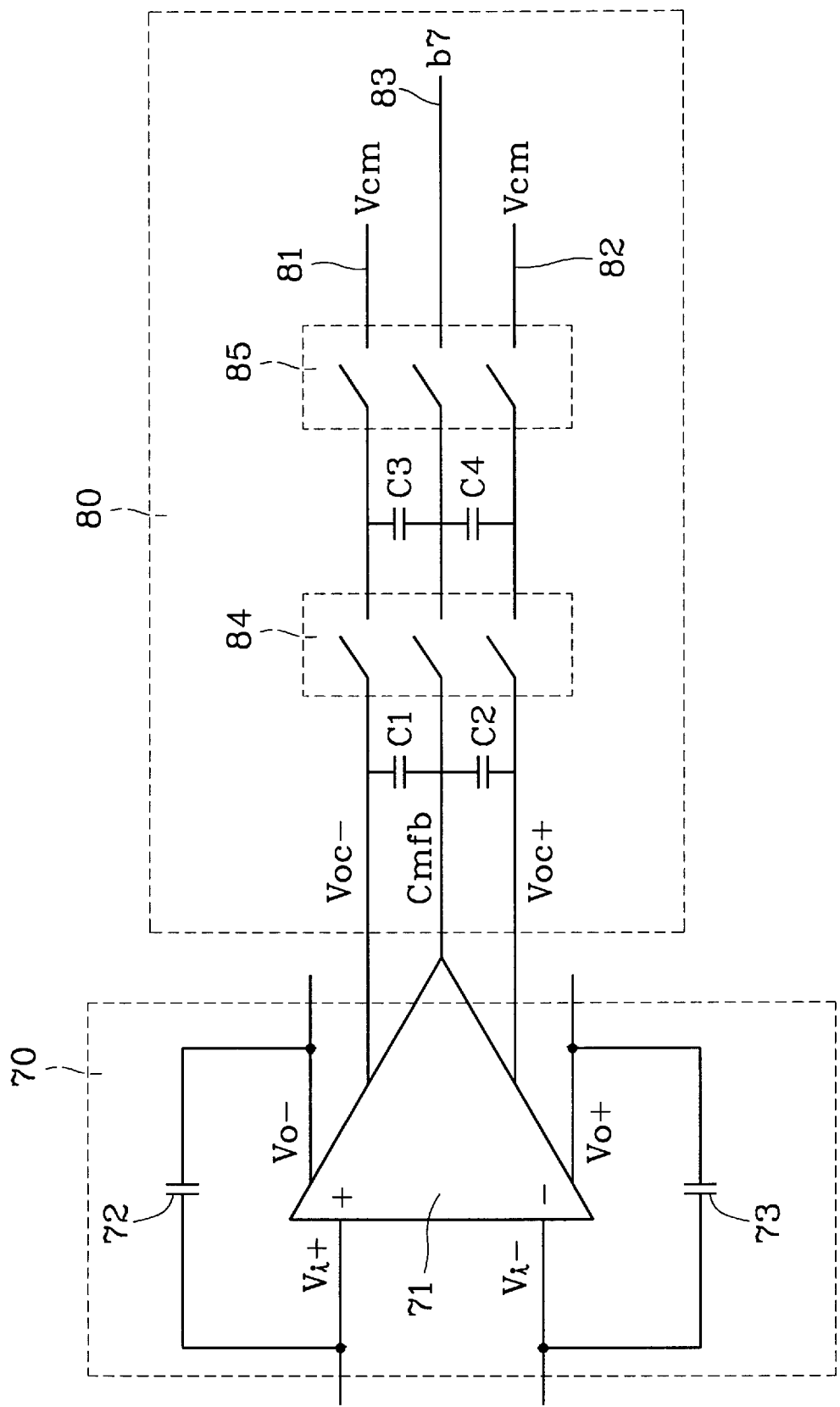
FIG. 6 is a schematic illustration of an embodiment according to the present invention.

FIG. 6 is a schematic illustration of an embodiment according to the present invention, which includes a balanced feed network 70 connected with a common mode feedback network 80. According to the present invention, there is an operation amplifier 71 in the balanced feed network 70, which enlarges the differential input voltage $V_{i+}$ and $V_{i-}$, and the capacitor 72, 73 are used for frequency compensation between the output voltage $V_{o-}$, $V_{o+}$ and input voltage $V_{i+}$, $V_{i-}$. The other output voltage signals of balanced feed network 70 are $V_{oc-}$, $V_{oc+}$. The common mode feedback signal (cmfb) connected to the common mode feedback network 80 that includes a first switching group 84 and a second switching group 85. The capacitor $C_1$, $C_2$ are installed between voltage $V_{oc}$, $V_{oc+}$ and signal cmfb, moreover, the capacitor $C_3$, $C_4$ are installed between the first switching group 84 and the second switching group 85. The output signals of second switching group 85 are the center signal terminal 81, 82 and bias signal terminal 83 (b7) for keeping the average value of the $V_{oc-}$ and $V_{oc+}$. The main difference between the present invention and the conventional switched capacitor filter is that the present invention has two output stages, in addition, it can be expanded more than two output stages (i.e., switching groups) while the user required.

These advantages may also be applied to the feedback control system of automatic electrical circuit.

While this invention has been described in connection with what is presently considered to be the most practical and preferred embodiment, it is to be understood that the invention is not limited to the disclosed embodiments, but on the contrary, it is intended to cover various modifications and equivalent arrangements included within the spirit and scope of the appended claims.

I claim:

1. A differential amplifier, comprising:
    an input stage for receiving differential input signals, and providing an output;
    a middle stage for amplifying the output of the input stage, and for providing an output;
    a negative feedback network having an output coupled to the input stage;
    a common mode feedback network having an output coupled to the middle stage;
    a first output stage coupled to receive the output of the middle stage and having an output coupled to the negative feedback network; and
    a second output stage coupled to receive the output of the middle stage and having an output coupled to the common mode feedback network.
2. The device of claim 1, wherein the second output stage is a replica of the first output stage.
3. The device of claim 1, wherein the common mode feedback network is coupled between the second output stage and the output of the input stage.
4. The device of claim 1, wherein the first and second output stages are comprised of MOS transistors, each having a size.
5. The device of claim 4, wherein the size of the MOS transistors of the second stage is a predetermined ratio of the size of the MOS transistors of the first stage.

* * * * *